United States Patent
Kuzmenka

(10) Patent No.: US 7,088,128 B2
(45) Date of Patent: Aug. 8, 2006

(54) CIRCUIT MODULE

(75) Inventor: Maksim Kuzmenka, Munich (DE)

(73) Assignee: Infineon Technologies AG, Munich (DE)

( * ) Notice: Subject to any disclaimer, the term of this patent is extended or adjusted under 35 U.S.C. 154(b) by 14 days.

(21) Appl. No.: 10/833,927

(22) Filed: Apr. 28, 2004

(65) Prior Publication Data

US 2005/0242829 A1    Nov. 3, 2005

(51) Int. Cl.
*H03K 19/003*    (2006.01)

(52) U.S. Cl. .............................. 326/30; 326/32; 326/34; 326/86

(58) Field of Classification Search ............. 326/30–34, 326/86, 90
See application file for complete search history.

(56) References Cited

U.S. PATENT DOCUMENTS

| | | | | |
|---|---|---|---|---|
| 5,550,496 A | * | 8/1996 | Desroches | 327/108 |
| 6,304,098 B1 | * | 10/2001 | Drost et al. | 326/26 |
| 2004/0264267 A1 | * | 12/2004 | Nishio et al. | 365/200 |

* cited by examiner

*Primary Examiner*—Anh Q. Tran
(74) *Attorney, Agent, or Firm*—Slater & Matsil L.L.P.

(57) ABSTRACT

A circuit module comprises a first circuit chip (102*a*) and a second circuit chip (102*b*). Each circuit chip comprises a signal input (104*a*, 104*b*) and a reference input (106*a*, 106*b*). A first termination resistance (112) connects the signal inputs (104*a*, 104*b*) and a second resistance (114) connects the reference inputs (106*a*, 106*b*). A first termination resistance (116) connects the second signal input (104*b*) to the termination voltage (120) and a second termination resistance (118) connects the second reference input (106*b*) to the termination voltage (120). A first ratio between the first resistance (112) and the first termination resistance (116) corresponds to a second ratio between the second resistance (114) and the second termination resistance (118).

19 Claims, 9 Drawing Sheets

CIRCUIT MODULE

TECHNICAL FIELD

The present invention relates to a circuit module and in particular to a circuit module comprising a plurality of circuit chips each having a signal input and a reference voltage input.

BACKGROUND

Circuit chips receive a signal voltage at a signal input. In order to decide whether the received signal voltage is on a logical 1 or on a logical 0, the circuit chips compare the signal voltage to a reference voltage. If the signal voltage is above the reference voltage, a logical 1 will be detected and on the other side if the signal voltage is below the reference voltage, a logical 0 will be detected. Typically a plurality of circuit chips are connected to the same reference voltage. A memory module comprising a plurality of memory chips is an example for such a design.

FIG. 6 shows a computer memory system design according to the prior art. The memory system design comprises a memory module 600 and a memory controller 601. The memory module 600 comprises a plurality of memory chips 602a–602i. To be more specific, the memory module 600 comprises nine memory chips or DRAM chips 602a–602i. For reasons of clarity only the first two memory chips DRAM1 602a and DRAM2 602b, the middle memory chip DRAM5 602e and the last two memory chips DRAM8 602h and DRAM9 602i are provided with corresponding reference signs.

Each memory chip 602a to 602i comprises a signal input 604a to 604i which connects each memory chip 602a to 602i to a signal line 608. Further, each memory chip 602a to 602i comprises a reference signal input which connects each memory chip 602a to 602i to a reference voltage line 609 which is connected to the reference voltage supply Vref (Vref=receiver reference voltage). The signal line 608 is terminated by a termination resistance 616 to a termination voltage level Vtt. The termination resistance 616 is equal to a characteristic impedance of the signal line 608. The termination voltage Vtt is one half of a supply voltage level Vdd (not shown). (Vdd for modern memory modules typically is in range 1.5 to 3.3 V.) The memory modules 600a to 600i are connected to the signal line 608 by vias 622a to 622i and stubs 624a to 624i.

Thus, FIG. 6 shows a fly-by net structure which is very spread in the computer memory system design, especially because it is a simple solution for a signal bus routing on a printed circuit board like the memory module 600. In a memory system design, it allows to deliver an address or data information to a plurality of memory chips 602a to 602i.

The controller 601 generates a signal voltage which is applied on the signal line 608. The controller 601 comprises a signal driver 634, a driver resistance 636 (here the resistor is used just like a simplified model of the transistor driver) and, typically, a controller package 638. The controller 601 and the memory module 600 are arranged on a circuit board. A connection between the signal line 608 on the memory module 600 and the circuit board is provided by a connector 640.

The signal voltage applied to the signal line 608 by the controller 601 symmetrically changes around the termination voltage level Vtt which is equal to half the supply voltage level of the memory chips.

In a typical design, the driver resistance 636 is 15 ohm, the termination resistance 616 is 30 ohm. The characteristic impedance of the signal line 608 from the controller 601 to the first via 622a is 40 ohm and the characteristic impedance of the signal line 608 from the first via 622a to the termination resistance 616 is 60 ohm (but together with input capacitance of memory chips it gives about 30 Ohm of effective impedance). The length of the signal line 608 from the controller 601 to the connector 640 is typically 178 mm and the length from the connector 640 to the first via 622a is 25.4 mm. Additionally, there is a 7.5 mm long signal line 608 part between the connector 640 and the first via 622a comprising a characteristic impedance of 60 ohm. Portions of the signal line 608 between neighboring vias, like the portion between the first via 622a and the second via 622b is 15 mm. The length of the stubs 624a to 624i is 2.54 mm. The memory module 600, in this particular example, is a dual inline memory module (DIMM; DIMM=dual inline memory module) and comprises a plurality of signal layers. A motherboard lead-in and a DIMM lead-in at the connector 640 as well as via like the vias 622a to 622i are formed on an external signal layer. All other lines are formed on an internal layer.

FIG. 7 shows a DC resistor network model of the computer memory system described in FIG. 6. The lines, as shown in FIG. 6, are replaced by models for corresponding resistors. In particular, FIG. 7 illustrates a total resistance between each signal input 604a to 604i of each memory chip to the signal driver 634 and a resistance between neighboring signal inputs 604a to 604i. For reasons of clarity, only the first two signal inputs 604a, 604b, the fifth signal input 604h and the last signal input 604i are shown. Further, FIG. 7 shows the termination resistance 616 and the termination voltage Vtt and the driver resistance 636 as already described in FIG. 6. A resistance of a controller package, a motherboard lead-in and a connector (not shown in FIG. 7) are idealized by a package resistor 737. A lead-in resistor 738 and a lead-out resistor 739 modelize a resistance of the memory module lead-in and a memory module lead-out. Resistances 712a to 712h modelize the resistance of portions of the signal line shown in FIG. 6 between neighboring vias, the resistance of a via and a resistance of a stub to a memory chip as shown in FIG. 6.

Typically, the driver resistance 636 is 15 ohm, the package resistance plus lead-in trace resistance 737 is 0.8 ohm, the on DIMM lead-in resistance 738 is 0.08 ohm, the resistances (DRAM to DRAM trace) 712a to 712h are 0.1707 ohm each, the lead-out resistance 739 is 0.085 ohm and the termination resistance 616 is 30 ohm. A total resistance between the first signal input 604a, and the last signal input 604i is 1.36 ohm which is 8×0.1707 ohm. Resistance data are given for case of 0.1 mm wide and 0.045 mm thick copper trace.

According to the prior art, the signal driver 634 provides a signal voltage switching between 0 V and 1.5 V. The termination voltage Vtt is 0.75 V. Thus, there is always a DC current flowing through the resistors shown in FIG. 7. Between the first signal input 604a and the last signal input 604i there is a voltage drop due to the current through the resistors 712a to 712h.

FIG. 8 shows the DC model as is shown and already described in FIG. 7 along with eye diagrams 850a, 850e, 850i. The first eye diagram 850a shows the signal voltage at the first signal input 604a, the second eye diagram 850e shows the signal voltage at the fifth signal input 604e and the third eye diagram 850i shows the signal voltage at the ninth signal input 604i. The signal input 604e represents the signal input of the middle memory chip as shown in FIG. 6. The signal input 604a represents the signal input of the first memory chip and the signal input 604i the signal input of the last memory chip as shown in FIG. 6. For reasons of clarity the eye diagrams 850a, 850e, 850i only show transitions of the signal voltage from the low voltage level to the high voltage level or from the high voltage level to the low voltage level.

The signal driver of the controller 601 provides a voltage signal which switches between 0 V and 1.5 V. The termination voltage Vtt is at 0.75 V. The eye diagrams 850a, 850e, 850i are centered around the termination voltage Vtt. The vertical extension of the data eyes (in this case it is an amplitude of the signal) decreases from the first data eye 850a taken from the first signal input 604a over the second data eye 850e, taken from the middle signal input 604e to the third data eye 850i taken from the last data signal 604i. The reason for this effect is the voltage drop at the resistances 712a to 712h between the signal inputs 604a to 604i as described in FIG. 7. The voltage drop is due to a DC current between the termination voltage Vtt and the controller 601.

FIG. 9 shows a diagram showing signal voltages at the signal inputs of all memory chips shown in FIG. 6. There are data eyes at all DRAM inputs simulated with equivalent resistive network are put in top of each other. As in FIG. 8, transitions from a high voltage level to a low voltage level and the low voltage level to the high voltage level are shown. As can be seen, all eyes are centered at 0.75 V which is the termination voltage Vtt. A first vertical extension 961, corresponding to the first data eye, is larger than the last vertical extension 962, corresponding to the last data eye.

Any variations of the driver resistance or the termination resistance (shown in FIG. 6) does not influence the symmetrical behavior of the signal voltages. Nevertheless, the termination voltage Vtt has the disadvantage of requiring an additional voltage source beside the supply voltage source in order to provide a stable termination voltage level. Alternatively, the termination voltage Vtt is generated from the supply voltage by a pair of additional resistors (not shown) which have the disadvantage of consuming a lot of power. Moreover a very low inductive printed circuit board trace or plane is necessary to distribute the termination voltage Vtt to all termination resistors (actually in this example peak current in one line is +/−30 mA. Number of the command-address traces is normally 27, then peak value of current consumed from the termination source could be +/−0.45 A). To provide a stable termination voltage level Vtt, a well capacitive coupling to ground is necessary. The same disadvantages apply to the reference voltage Vref.

SUMMARY OF THE INVENTION

The preferred embodiment of the present invention provides a reliable circuit module. For example, a circuit module can be formed that includes a first circuit chip comprising a first signal input and a first reference input and a second circuit chip comprising a second signal input and a second reference input. A first resistance connects the first signal input and the second signal input and a second resistance connects the first reference input and the second reference input. A first termination resistance connects the second signal input to a termination voltage and a second termination resistance connects the second reference input to the termination voltage. In the preferred embodiment, a first ratio between the first resistance and the first termination resistance corresponds to a second ratio between the second resistance and the second termination resistance.

Aspects of the present invention are based on the finding that each SDRAM in a chain is optimized with a separate reference voltage Vref for an optimum receiving condition. An optimal method for generating separate reference voltages is shaping a reference voltage Vref with topologically the same trace as a signal trace in similar load conditions.

Thus, it is advantageous to form a resistance between the reference inputs of circuit chips. The resistance between the reference inputs corresponds to a resistance between signal inputs. This allows to terminate a signal line which connects the signal inputs to a supply voltage level of the circuit chips instead of a termination voltage level being half of the supply voltage level. Thus, there is no need to generate an additionally termination voltage. The supply voltage is very stable as normally, it is distributed by a low inductive copper plane on a printed circuit board and has a very good coupling to a printed circuit board ground plane. A stable termination voltage increases a reliability and quality of a transmitted signal information. Further, a cost reduction or a decrease in the power consumption is achieved as no additional power supply and no additional voltage divider for supplying the termination voltage is necessary.

According to an embodiment, the termination voltage is equal to the supply voltage, while focus of this embodiment of the invention is a way of distribution of the Vref. This makes a design of an n-channel MOSFET transistor based receiver in the circuit chip more easy and the characteristic of the receiver better. This is based on the effect that a center of eye diagrams, corresponding to at signal inputs of the chips increases from the first chip to the second chip.

In systems with Vtt=Vdd/2 termination a further reduction in the power consumption could be achieved by deactivation of both output transistors and putting the driver in to Z state. In this case, Z state is not necessary, because of just driving a logical 1 makes 0 current and 0 power consumption.

BRIEF DESCRIPTION OF THE DRAWINGS

Preferred embodiments of the present invention are described hereinafter making reference to the appended drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
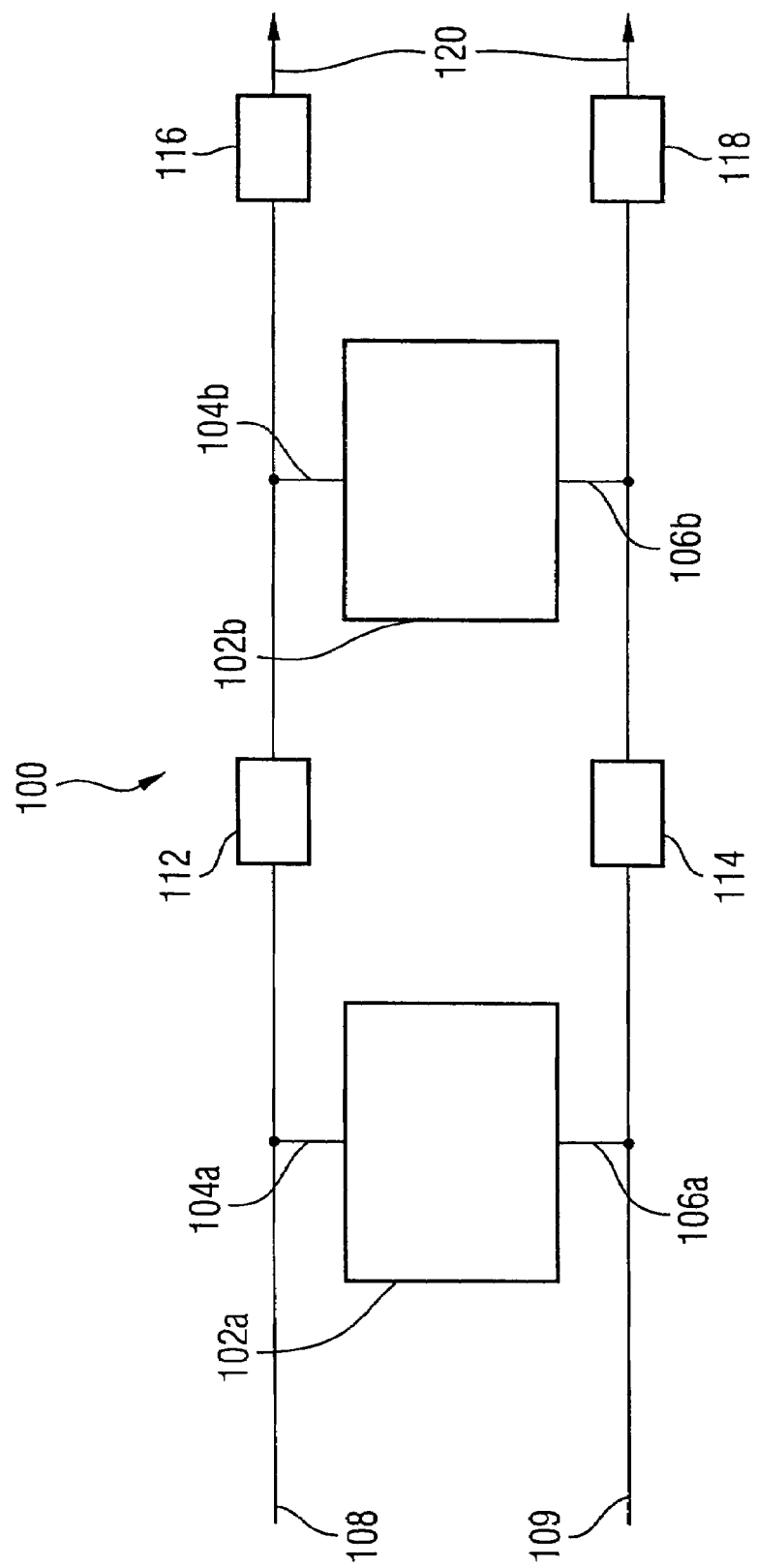
FIG. 1 shows a schematic view of a circuit module according to a first embodiment of the present invention.

FIG. 1 shows a schematic view of a circuit module according to a preferred embodiment of the present invention. The circuit module 100 comprises a first circuit chip 102a and a second circuit chip 102b. The first circuit chip 102a comprises a first signal input 104a and the second circuit chip 102b comprises a second signal input 104b. Further, the first circuit chip 102a comprises a first reference input 106a and the second circuit chip 102b comprises a second reference input 106b. A signal line 108 is connected to the first signal input 104a and a reference line 109 is connected to the first reference input 106a of the first circuit chip 102a. The first signal input 104a is connected to the second signal input 104b via a first resistor 112 and the first reference input 106a is connected to the second reference input 106b via second resistor 114. The second signal input 104b is connected via a first termination resistor 116 to a termination voltage supply 120. The second reference input 106b is connected via the second termination resistance 118 to the termination voltage supply 120.

The signal line 108 applies a signal voltage to the first signal input 104a. The signal voltage switches between the termination voltage level 120 and a second voltage level. The termination voltage level 120 on the signal line 108 corresponds to a first logical value transmitted over the signal line 108 to the first signal input 104a and the second voltage level on the signal line 108 corresponds to a second logical value transmitted to the first signal input 104a. In order to decide whether the termination voltage level 120 or the second voltage level is applied at the first signal input 104a, the first circuit chip 102a compares the signal voltage applied at the first signal input 104a to a reference voltage applied at the reference input 106a.

The reference line 109 supplies a reference voltage to the first reference input 106a. Typically the reference voltage is a middle value between the termination voltage level 120 and the second voltage level. If the signal voltage at the first signal input 104a is above the reference voltage at the first reference input 106a, the first logical value is detected and if the signal voltage is below the reference voltage, the second logical value is detected by the first circuit chip 102a.

Due to the first resistor 112, there is a voltage drop between the second signal input 104b and the first signal input 104a. Thus, at the second signal input 104b, the signal voltage applied by the signal line 108 switches between the termination voltage level 120 and a third voltage level. A difference between the termination voltage level 120 and the third voltage level is smaller than a voltage difference between the termination voltage level 120 and the second voltage level. Therefore, a middle value between the termination voltage level 120 and the third voltage level is different to the middle value of the termination voltage level 120 and the second voltage level.

In order to detect whether the termination voltage level 120 or the third voltage level is applied at the second signal input 104b, a second reference voltage is to be applied at the second reference input 106b. The second reference voltage at the second reference input 106b compensate the difference between the third voltage level applied to the second circuit chip 102b and the second voltage level applied to the first circuit chip 102a and guarantees that the second circuit chip 102b detects whether the termination voltage level 120 or the third voltage level is applied to the second signal input 104b. Providing the first reference voltage to the second circuit chip 102b could lead to a wrong signal voltage detection or increased sensitivity to noise and as consequence a large error rate.

The second reference voltage can be generated separately to the first reference voltage. Nevertheless, according to the present invention a voltage divider is advantageously used to apply the second reference voltage to the second reference input 106b. In this embodiment, the voltage divider comprises two resistors 114 and 118. Typically the second resistor 114 comprises the same resistance as the first resistor 112 and the second termination resistor 118 comprises the same resistance as the first termination resistor 116. In order to reduce the power consumption on the reference line 109, the second resistor 114 and the second termination resistor 118 may have a higher value than the resistances on the signal line 108. In this case, a ratio between the values of the second resistor 114 and the second termination resistor 118 is equal to a ratio between the first resistor value 112 and the first termination resistor value 116.

Typically the first resistor 112 is not a discrete resistor element but rather the resistance of a portion of the signal line 108 between the first signal input 104a and the second signal input 104b. The resistance 112 should be as small as possible. The value of the resistor 116 is typically equal to a loaded (or equivalent) characteristic impedance of the signal line 108.

The circuit module 100 can be a separate module or part of a larger design. Therefore, the signal line 108 and the reference line 109 can be directly connected or connected via a connector to a means for providing the signal voltage and the reference voltage to the circuit module.

The termination voltage is preferably either the supply voltage or a ground voltage. In other embodiments, however, other voltage levels could be used.

Typically, the first termination resistor 116 is coupled to a first termination voltage and the second termination resistor 118 is coupled to a second termination voltage where the first termination voltage is identical to the second termination voltage. Alternatively, the first termination voltage and the second termination voltage can be different. In this case the resistances of the reference line should be chosen to provide the correct reference voltages.

Figure 6:
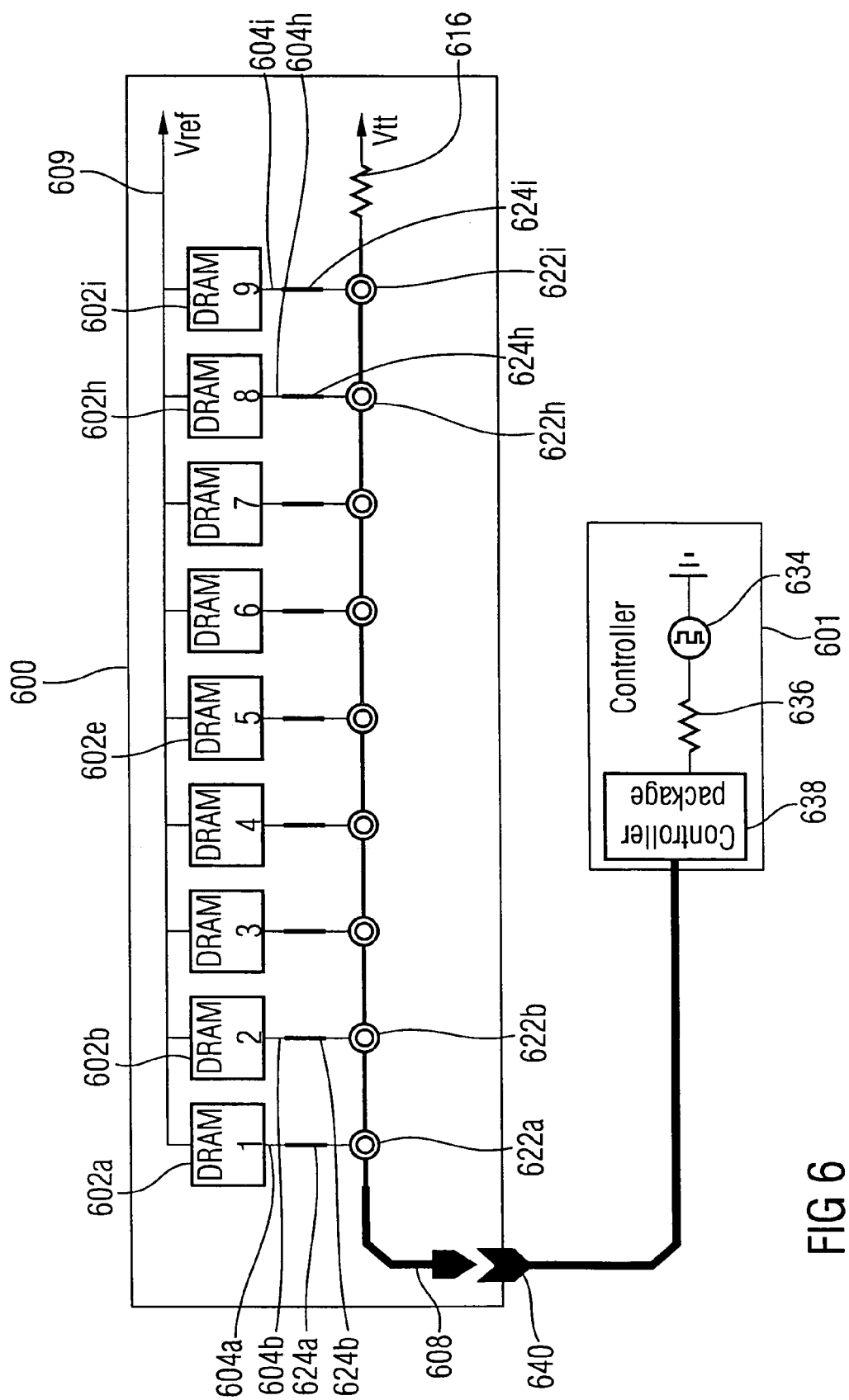
FIG. 6 shows a schematic view of a memory system according to the prior art.

As described in the following embodiments, the inventive approach can advantageously be used for a memory design as illustrated in FIG. 6.

Figure 2:
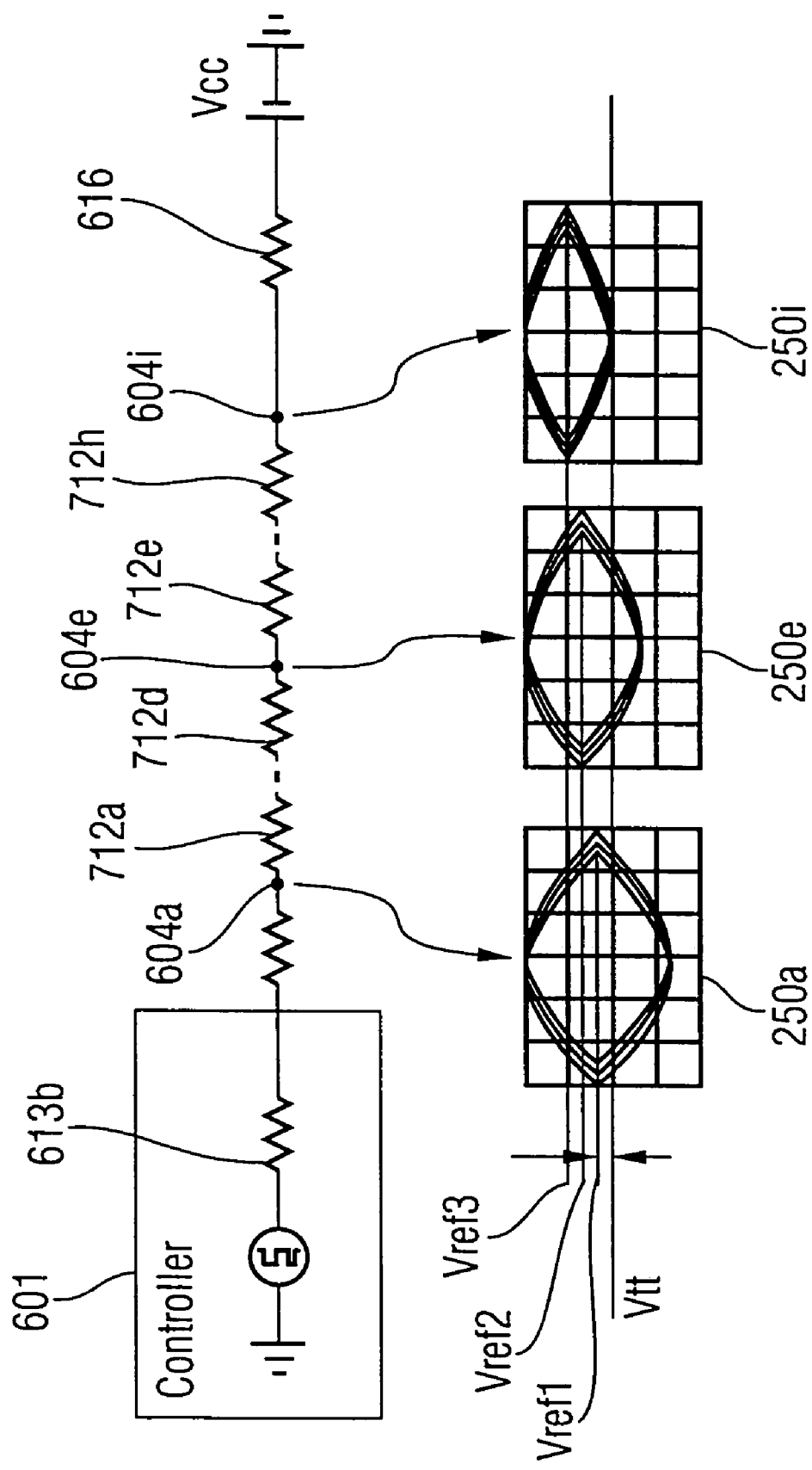
FIG. 2 shows a DC resistance model of the memory system shown in FIG. 6 and corresponding eye diagrams according to embodiments of the present invention.
Figure 8:
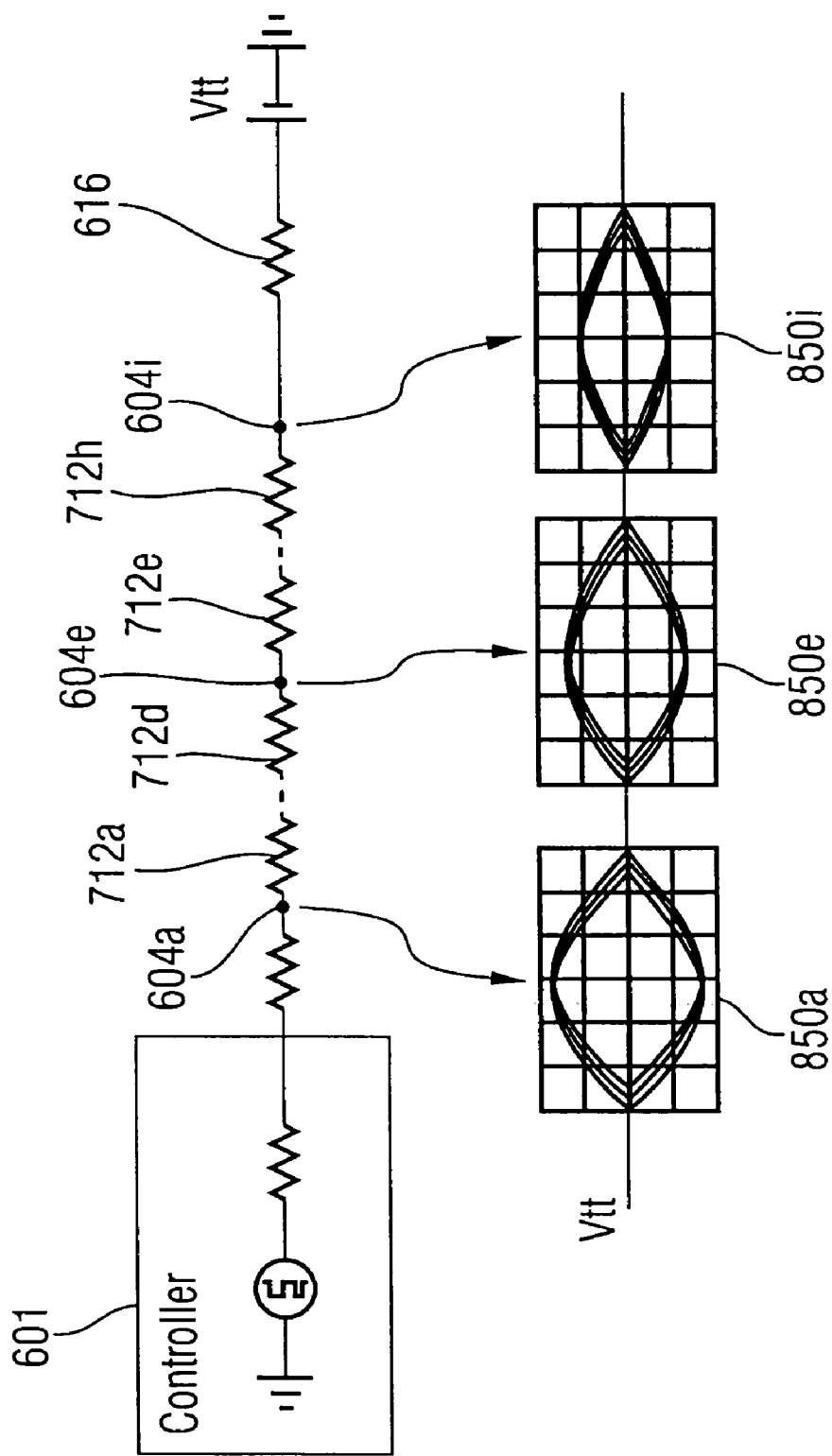
FIG. 8 shows an eye diagram of the signal voltage of the memory system memory system shown in FIG. 6.

FIG. 2 shows a DC resistance model of a memory module as it is shown in FIG. 6, only with the difference, that the termination voltage is not half the supply voltage but the supply voltage level Vcc which is the supply voltage of the memory chips. All the other elements are the same as already described with respect to FIG. 8 and therefore have the same reference signs.

The controller 601 generates a signal voltage that switches between the supply voltage Vcc and the ground voltage level. Due to a driver resistance 636 within the controller 601 and a further resistance, modelizing resistances between the controller and the first signal input 604a, the signal voltage switches at a first signal input 604a which is connected to a first memory chip (as shown in FIG. 6) between the supply voltage level Vcc and a second voltage level which is above the ground voltage level.

An eye diagram 250a shows the signal voltage at the first signal input 604a. As in FIG. 8, for reasons of clarity, FIG. 2 shows only the first signal input 604a, a fifth signal input 604e which represents the signal input of the middle memory chip and a ninth signal input 604i which represents a signal input of a last memory chip (as shown in FIG. 6). An eye diagram 250e shows the signal voltage at the fifth signal input 604e and an eye diagram 250i shows the signal voltage at the last signal input 604i.

As can be seen from the eye diagrams, the upper value of the eye diagrams is always at the supply voltage level Vcc. As already described in FIG. 8, the vertical distance of the eye diagrams is becoming smaller from the first eye diagram 250a to the last eye diagram 250i. Due to the termination voltage being the supply voltage, the lower voltage of the eye diagrams is raising from the first eye diagram 250a to the last eye diagram 250i. This effect is due to the termination voltage being not at a middle value of the signal voltage provided by the controller 601 but at the high supply voltage value Vcc which corresponds to the upper voltage value provided by the controller 601.

In this example, the signal is a data or address signal of a memory module. Alternatively, the signal can be a control signal. As can be seen from the eye diagram, each following of the signal inputs 604e, 604i has a smaller data eye due to a resistance attenuation and in addition each next signal eye is shifted up to the termination voltage Vcc. If a reference voltage Vref stays the same for all data eyes, the intersymbol interference and an open data width ODW will degrade. FIG. 2 shows the ideal reference voltage values Vref 1, 2, 3 corresponding to eye diagrams 250a, 250e, 250i. The ideal reference voltage levels Vref 1, 2, 3 are equal to the center values of the eye diagram. Actually in case of 1.5V Vdd, 15 Ohm Ron and 30 Ohm Rterm, Ideal Vref will be 1V—what could be seen on FIG. 3. This voltage shift is due to the lead-in resistance of the module.

Figure 7:
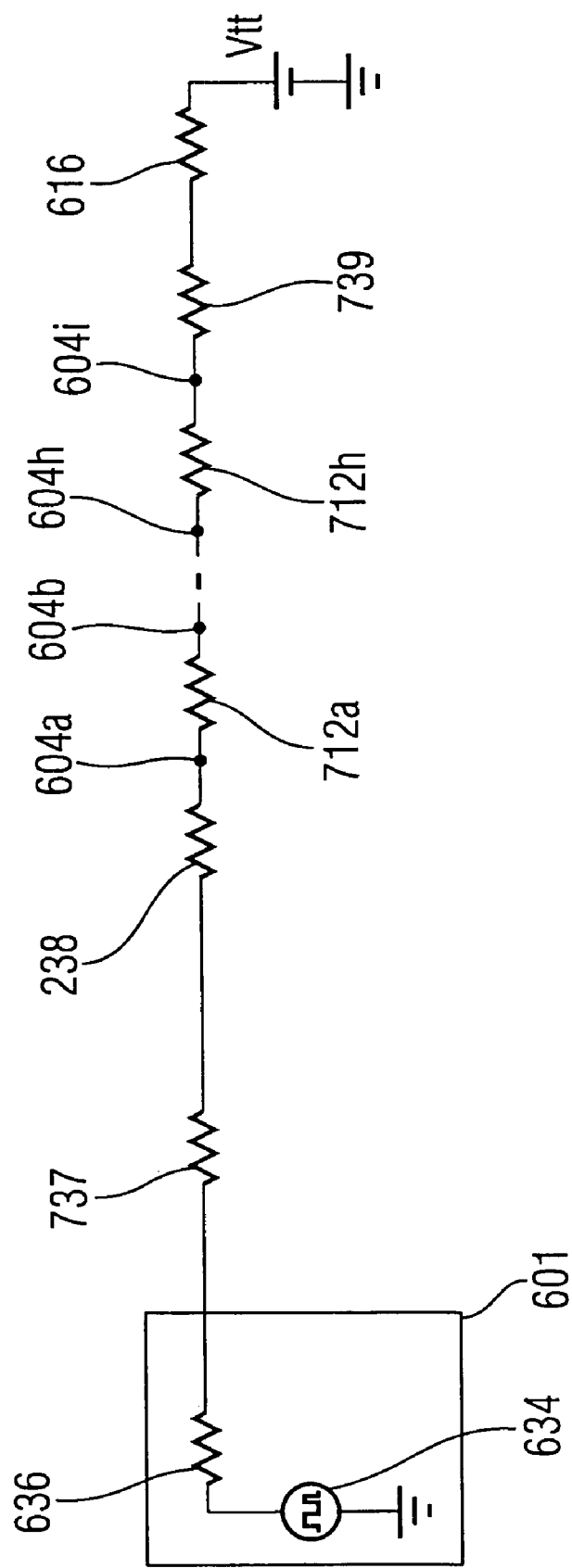
FIG. 7 shows a DC resistance model of the memory system shown in FIG. 6.

In case of the controller 601 generating a 0V signal voltage, the supply voltage being at 1.5V and the resistor values being as described in FIG. 7, a current of 31.6 mA is flowing through resistor 636 and a voltage difference of 0.043 V occurs between the first signal input 604a and the last signal input 604i.

Figure 3:
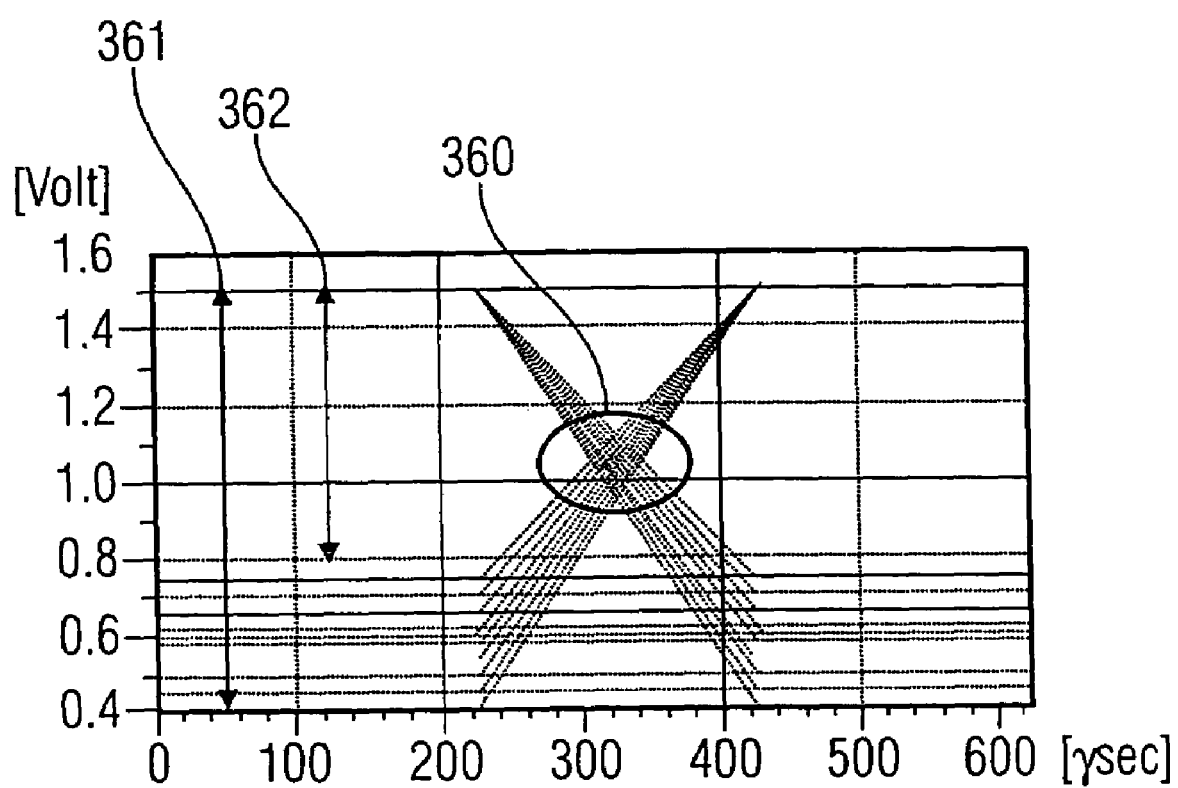
FIG. 3 shows a diagram of the supply voltage in a circuit module shown in FIG. 2.

FIG. 3 shows the crossing points of the data eyes of the signal voltages and the signal inputs of the nine memory chips as shown in FIG. 6. As can be seen from FIG. 3, the crossing points of the data eyes are not centered but each eye has its own center within a region 360. Again the vertical extension 361 of the first data eye corresponding to the first signal input is larger than the vertical extension 362 of the last data eye corresponding to the ninth signal input. Moreover the upper voltage level of the vertical extensions 361, 362 is at the supply voltage level Vcc of 1.5 V. As already described in FIG. 2, the lower voltage level of the vertical extension 361, 362 is raising from the first signal input to the last signal input.

Figure 9:
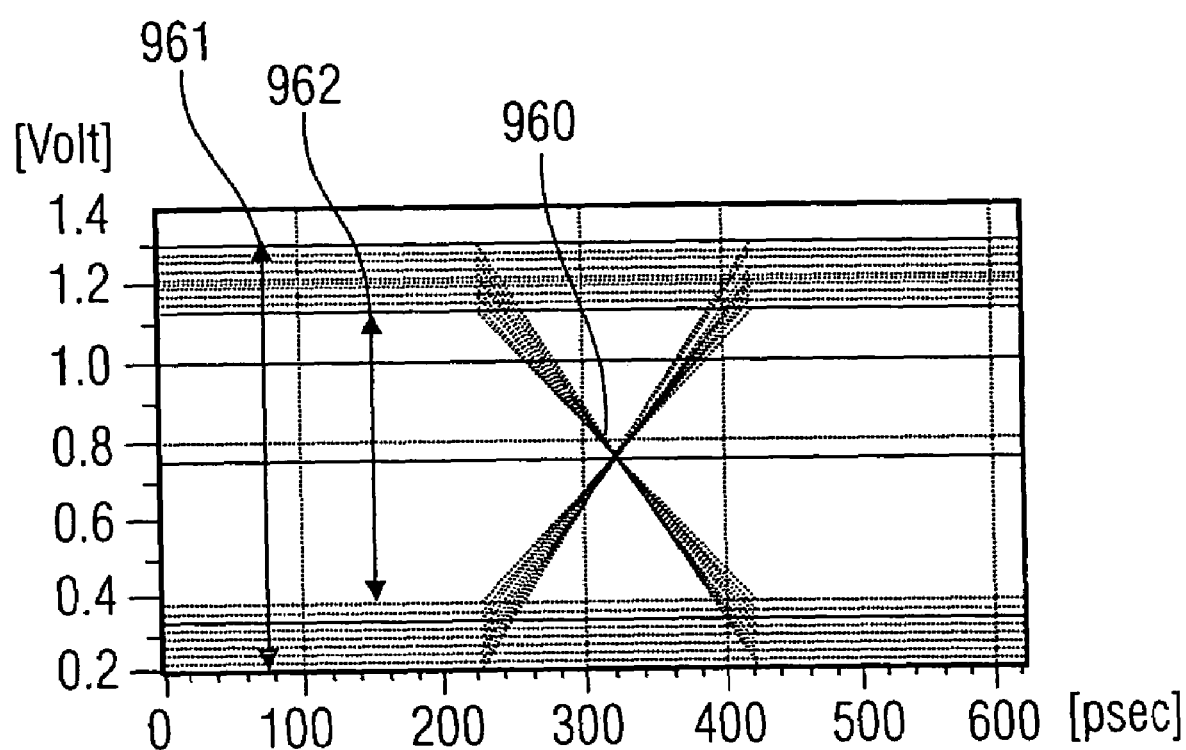
FIG. 9 shows a diagram of the signal voltage of the memory system memory system shown in FIG. 6.

FIG. 9 and FIG. 3 rely on a simulation with PRBS (PRBS; PRBS=Pseudo Random Bit Sequence) and a resistive model without any inductance L and capacity C. For a better picture, the segment resistance between neighboring signal inputs is assumed to be ten times larger than described in FIG. 7. For simulation the resistance 712a to 712h are assumed to be 1.7 ohm. FIGS. 9 and 3 show the voltage signals at all DRAMs along the memory module.

Figure 4:
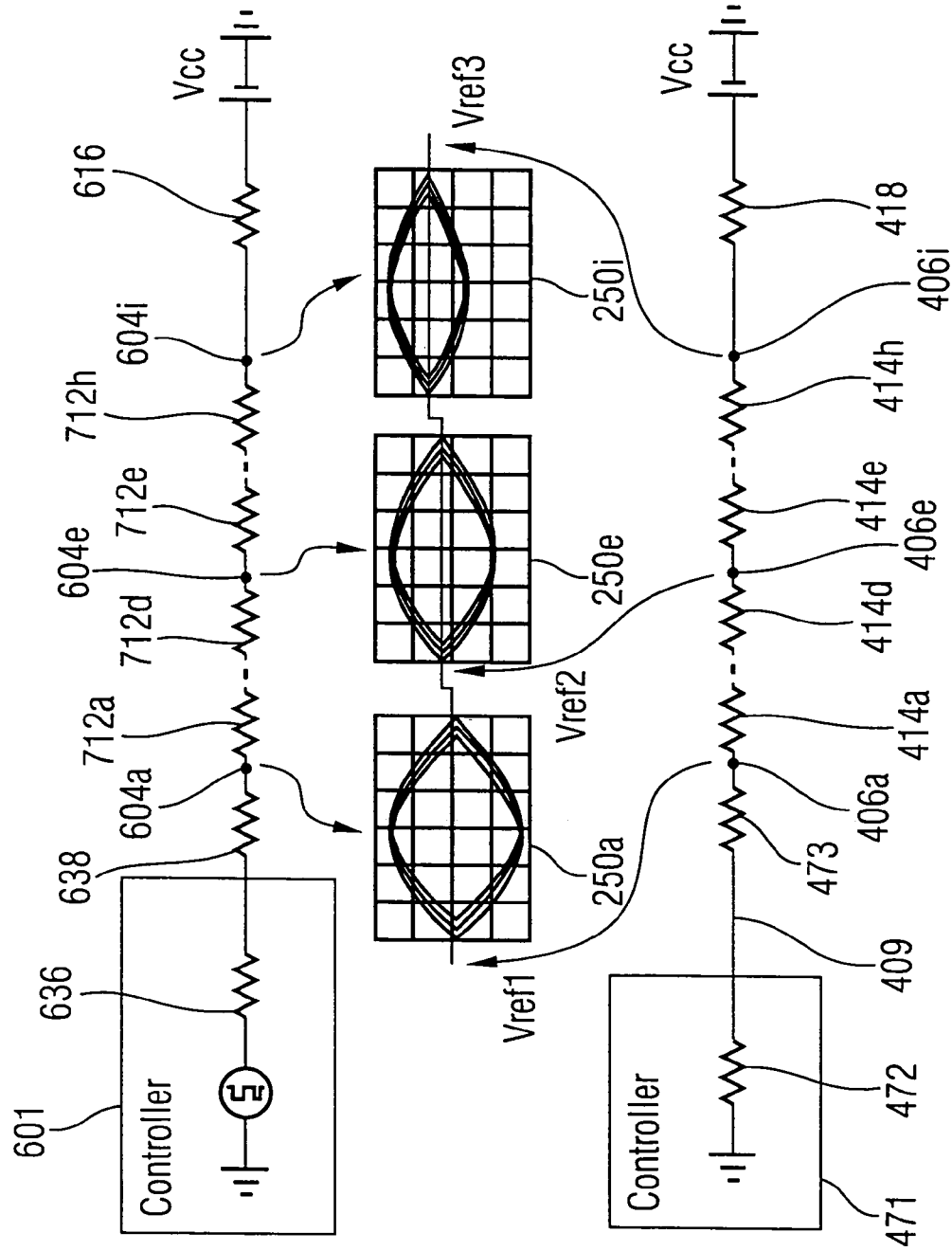
FIG. 4 shows a DC resistance model of the memory system shown in FIG. 2 and a corresponding reference voltage line according to the present invention.

FIG. 4 shows the DC resistive model described in FIG. 2 together with the corresponding eye diagrams as shown in FIG. 2. As described in FIG. 2, the reference voltages Vref1, 2, 3 are different for each eye diagram 250a, 250e, 250i. Therefore each memory chip in the chain needs a separate reference voltage supply for an optimum receiving condition. According to the example shown in FIG. 4, the reference voltages Vref1, 2, 3 are shaped with an additional trace which has the same topology as the signal trace and therefore similar load conditions.

As already described in FIG. 6, each memory module has a signal input and a reference input. FIG. 4 shows a first reference input 406a of a first memory chip, a second reference input 406e corresponding to a middle memory chip and a third reference input 406i corresponding to a last memory chip of the memory module. Reference resistors 414a to 414h are arranged between neighboring reference inputs 406a–i. A first reference resistor 414a is arranged between the reference input 406a and a second reference input (not shown in FIG. 4), for example.

A termination resistor 418 connects the last reference input 406i to the supply voltage Vcc. Within a controller 471 for the reference signal, a controller resistance 472 is shown which connects the reference signal 409 to the ground level. The termination resistor 418 corresponds to the termination resistor 616 of the signal line. In this embodiment, both termination resistors 616, 418 have a resistance of 30 ohm. The resistors 414a–h correspond to the resistances 712a–h and are formed such that they have the same resistance. Further the resistor 473 which models a lead-in resistance of the memory module corresponds to the resistor 638 of the signal line and has the same value.

The first reference voltage Vref1 is at a voltage level of 1 V, in this example. To achieve this voltage level at the first reference input 406a, the controller resistance 472 has a value of two times of the driver resistance 636. In this example the driver resistance 636 is 15 Ohm and the controller resistance 472 is 30 Ohm, 2 times larger then the driver resistance 636. Thus, the reference voltages Vref1, 2, 3 are realized by a voltage divider comprising a plurality of resistors 472, 473, 414a–h, 418 arranged between the supply voltage Vcc and the ground level.

According to a further embodiment, the reference controller 471 comprises a switch (not shown) for switching the reference line 409 to the ground level as shown in FIG. 4 or alternatively to the supply voltage level Vcc.

The switch is controlled by a mode signal (not shown). The mode signal indicates if the signal controller 601 is active or inactive. In case that no valid signal is transmitted by the controller 601, no valid reference voltages Vref1, 2, 3 are necessary. In such a state the switch connects the reference line 409 to the supply voltage level VCC. This reduces the power consumption as no current is flowing through the resistors 472, 473, 414a–h and 418.

Figure 5:
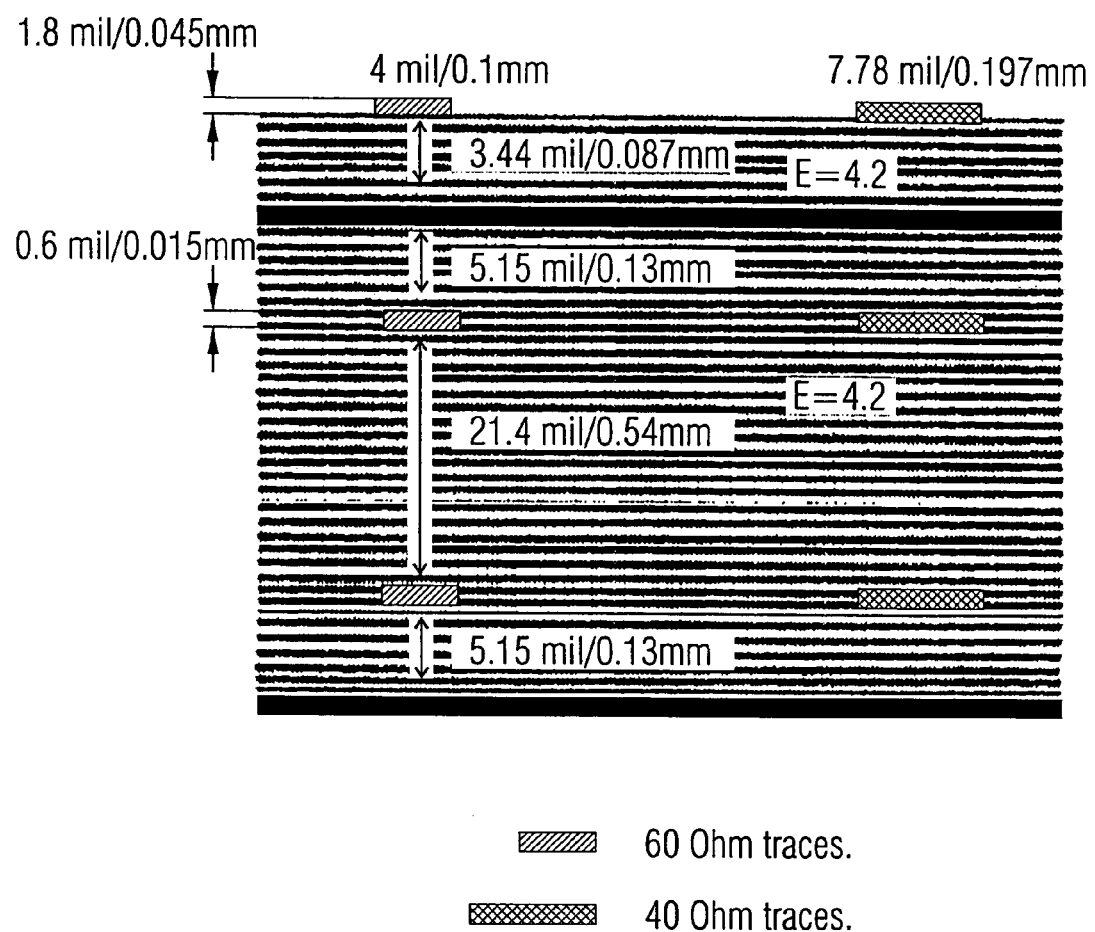
FIG. 5 shows a cross section through a circuit module according to an embodiment of the present invention.

FIG. 5 shows a board stack up as it was used for the above-described simulations. Signal lines on the left hand side correspond to 60 ohm signal traces and signal lines on the right hand side correspond to 40 ohm signal traces. Signal lines on the surface of the board are 1.8 mil thick and signal lines within the board stack are 0.6 mil thick. 60 ohm traces are 4 mil wide and 40 ohm traces are 7.78 mil wide.

The voltage values and resistor values described in the above embodiments are typical values. Other values are possible as long as the described ratio between the resistors of the reference line equals the ratio of the resistors of the signal line. Especially the resistances between the signal inputs and the reference inputs are typically realized by signal traces. Nevertheless discrete resistor elements can be used. The circuit chips or memory chips as described in the embodiments comprise a means for detecting information transmitted on the signal line. Typically the means for detecting is a receiver like a n-channel MOSFET transistor based receiver. Nevertheless, any other kind of receivers can be used.

The following table provides a list of the reference numerals used herein.

| Ref No. | Element |
|---|---|
| 100 | circuit module |
| 102a | first circuit chip |
| 102b | second circuit chip |
| 104a | first signal input |
| 104b | second signal input |
| 106a | first reference input |
| 106b | second reference input |
| 108 | signal line |
| 109 | reference line |
| 112 | first resistor |
| 114 | second resistor |
| 116 | first termination resistor |
| 118 | second termination resistor |
| 250a, e, i | eye diagrams |
| Vref1, 2, 3 | reference voltage |
| 360 | center of the eyes |
| 361 | extension of the first eye |
| 362 | extension of the last eye |
| 406a–i | reference inputs |
| 414a–h | reference resistors |
| 418 | reference termination resistor |
| 409 | reference line |
| 471 | controller |
| 472 | driver resistance |
| 473 | lead-in resistance |
| 600 | memory module |
| 601 | controller |
| 602a–i | DRAM |
| 608 | signal line |
| 609 | reference line |
| 616 | termination resistor |
| 622a–h | via |
| 624a–h | stubs |
| 634 | signal driver |
| 636 | driver resistance |
| 638 | package |
| 640 | connector |
| 712a–h | signal resistance |
| 737 | package resistance |
| 738 | lead-in resistance |
| 739 | lead-out resistance |
| 850a, e, i | eye diagram |
| 960 | center of the eye diagram |
| 961 | extension of the first eye diagram |
| 963 | extension of the last eye diagram |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit arrangement including a plurality of circuit modules comprising:
a controller circuit for providing a source of input signals, a source reference voltage, a first termination voltage, and a second termination voltage;
an input signal bus having a first end connected to receive said input signals and a second end connected to said first termination voltage;
a reference voltage bus having a first end connected to said source reference voltage and a second end connected to said second termination voltage;
a first circuit chip comprising a first signal input connected to said input signal bus and a first reference input connected to said reference voltage bus, said first circuit chip operable to detect information by comparing a first signal voltage applied to the first signal input and a first reference voltage applied to the first reference input;
a second circuit chip comprising a second signal input connected to said input signal bus and a second reference input connected to said reference voltage bus, said second circuit chip operable to detect information by comparing a second signal voltage applied to the second signal input and a second reference voltage applied to the second reference input;
a first resistance between the first signal input and the second signal input;
a second resistance between the first reference input and the second reference input;
a first termination resistor connecting the second signal input to said second end of said input signal bus;
a second termination resistor connecting the second reference input to said second end at said reference voltage bus; and
a first ratio between the first resistance and the first termination resistor corresponding to a second ratio between the second resistance and the second termination resistor.

2. The circuit module according to claim 1, wherein the first signal voltage applied to the first signal input switches between the first termination voltage and a second voltage level and wherein the second signal voltage applied to the second signal input switches between the first termination voltage and a third voltage level.

3. The circuit module according to claim 2, wherein a voltage difference between the second voltage and the third voltage is about two times the voltage difference between the first reference voltage and the second reference voltage.

4. The circuit module according claim 1, wherein the first termination voltage and the second termination voltage are both at a voltage level equal to a supply voltage of the circuit chips.

5. The circuit module according claim 1, wherein the first termination voltage and the second termination voltage are both at a voltage level equal to a ground voltage.

6. The circuit module according claim 1, wherein the first termination resistance is equal to the impedance of a signal line coupled to the first signal input and the second signal input.

7. The circuit module according claim 1, wherein the first resistance is a signal line between the first signal input and the second signal input.

8. The circuit module according claims 1, wherein the first signal input is connected to a first n-channel MOSFET transistor receiver within the first circuit chip and the second signal input is connected to a second n-channel MOSFET transistor receiver within the second circuit chip.

9. The circuit module according to claim 1, wherein the first resistance is equal to the second resistance.

10. The circuit module according to claim 1, wherein the first and second circuit chips are DRAM chips.

11. The circuit module according to claim 1, wherein the first termination voltage and the second termination voltage are identical.

12. A circuit arrangement including a plurality of circuit modules comprising:

a controller circuit for providing a source of input signals, a source reference voltage, a first termination voltage, and a second termination voltage;

a circuit board including an input signal bus having a first end connected to receive said input signals and a second end connected to said first termination voltage, and a reference voltage bus having a first end connected to said source reference voltage and a second end connected to said second termination voltage;

a first circuit chip disposed on the circuit board, the first circuit chip comprising a first signal input connected to said input signal bus and a first reference input connected to said reference voltage bus;

a second circuit chip disposed on the circuit board, the second circuit chip comprising a second signal input connected to said input signal bus and a second reference input connected to said reference voltage bus;

a first resistance connecting the first signal input and the second signal input;

a second resistance connecting the first reference input and the second reference input;

a first termination resistance connecting the second signal input to said second end of said input signal bus; and a second termination resistance connecting the second reference input to said second end of said reference voltage bus;

wherein a signal from said source of input signals applied to the first signal input varies between a first voltage level and a second voltage level and wherein a signal applied to the second signal input varies between the first voltage level and a third voltage level, wherein the difference between the first voltage level and the second voltage level is larger than the difference between the first voltage level and the third voltage level;

wherein a reference voltage from said reference voltage source applied to the first reference input is at a level about halfway between the first voltage level and the second voltage level; and wherein a reference voltage from said reference voltage source applied to the second reference input is at a level about halfway between the first voltage level and the third voltage level.

13. The circuit module of claim 12 wherein the first voltage level is a supply voltage of the first and second circuit chips.

14. The circuit module of claim 12 wherein the first voltage level is a ground voltage.

15. The circuit module of claim 12 wherein the first termination voltage is equal to the second termination voltage, wherein the first resistance is equal to the second resistance, and wherein the first termination resistance is equal to the second termination resistance.

16. The circuit module of claim 15 wherein the first resistance comprises a signal line between the first signal input and the second signal input and wherein the second resistance comprises a signal line between the first reference input and the second reference input.

17. The circuit module of claim 16 wherein the first resistance consists of a signal line between the first signal input and the second signal input and wherein the second resistance consists of a signal line between the first reference input and the second reference input.

18. The circuit module of claim 12 wherein the first and second circuit chips are DRAM chips.

19. A circuit module comprising:

a first circuit chip comprising a first signal input and a first reference input said first circuit chip operable to detect information by comparing a first signal voltage applied to the first signal input and a first reference voltage applied to the first reference input;

a second circuit chip comprising a second signal input and a second reference input, said second circuit chip operable to detect information by comparing a second signal voltage applied to the second signal input and a second reference voltage applied to the second reference input;

a first resistor between the first signal input and the second signal input;

a second resistor between the first reference input and the second reference input;

a first termination resistor connecting the second signal input to a first termination voltage;

a second termination resistor connecting the second reference input to a second termination voltage; and a first ratio between the first resistor and the first termination resistor corresponding to a second ratio between the second resistor and the second termination resistor.

* * * * *